(12) United States Patent
Harmon et al.

(10) Patent No.: US 7,456,616 B2
(45) Date of Patent: Nov. 25, 2008

(54) CURRENT SENSOR FOR ELECTRIC MACHINE CONTROL

(75) Inventors: Jack D. Harmon, Carmel, IN (US); Michael D. Bradfield, Anderson, IN (US)

(73) Assignee: Remy Technologies, L.L.C., Anderson, IN (US)

( * ) Notice: Subject to any disclaimer, the term of this patent is extended or adjusted under 35 U.S.C. 154(b) by 120 days.

(21) Appl. No.: 11/498,380

(22) Filed: Aug. 1, 2006

(65) Prior Publication Data

US 2007/0029992 A1 Feb. 8, 2007

Related U.S. Application Data

(60) Provisional application No. 60/705,412, filed on Aug. 4, 2005.

(51) Int. Cl.
*H02J 7/14* (2006.01)
(52) U.S. Cl. ............................................ 322/27; 322/37

(58) Field of Classification Search ............... 290/40 R, 290/41, 40 B; 322/27, 28, 37, 22, 21, 25; 323/222, 282
See application file for complete search history.

(56) References Cited

U.S. PATENT DOCUMENTS

| 4,163,190 | A | * | 7/1979 | Moerman | 323/250 |
| 4,829,228 | A | * | 5/1989 | Buetemeister | 322/27 |
| 5,399,957 | A | * | 3/1995 | Vierboom | 323/282 |
| 5,450,000 | A | * | 9/1995 | Olsen | 323/222 |
| 5,493,200 | A | * | 2/1996 | Rozman et al. | 322/10 |
| 5,625,276 | A | * | 4/1997 | Scott et al. | 322/24 |
| 5,929,609 | A | * | 7/1999 | Joy et al. | 322/25 |
| 5,965,998 | A | | 10/1999 | Whiting et al. | 320/165 |
| 6,369,532 | B2 | * | 4/2002 | Koenen et al. | 318/150 |

* cited by examiner

*Primary Examiner*—Nicholas Ponomarenko
(74) *Attorney, Agent, or Firm*—Cantor Colburn LLP

(57) ABSTRACT

The disclosed apparatus relates to a current sensing electrical energy generation system comprising, an electric machine, a conductor electrically connected to the electric machine, and a current sensor responsive to current flow in the conductor.

12 Claims, 6 Drawing Sheets

CURRENT SENSOR FOR ELECTRIC MACHINE CONTROL

CROSS REFERENCE TO RELATED APPLICATIONS

This application claims the benefit of an earlier filing date from U.S. provisional application, 60/705,412, filed Aug. 4, 2005, the entire contents of which are incorporated herein by reference.

BACKGROUND OF THE INVENTION

An electrical system for a modern motor vehicle, among other items includes; a battery, an alternator, a regulator and a myriad of motors, sensors, computers, lights and other electronic devices which are interconnected with wiring. These electronic devices draw varying amounts of electrical current depending upon their function and how they are being utilized. The alternator/regulator assembly generates electrical current by converting rotational energy into electrical energy. An engine, typically through pulleys and belts, supplies the rotational energy to the alternator/regulator assembly. Therefore, whenever the engine is running, the alternator is rotating.

The torque required to rotate the alternator is proportional to the current that it is producing. A sudden increase in current production and the associated increase in torque required to rotate the alternator is significant enough to cause the engine speed to reduce by a few hundred RPM. These changes in engine RPM are perceived as poor idle quality and can cause a drop in fuel economy. It may be desirable to minimize the changes in engine RPM. Accordingly, there is a need for improvements in the art of alternator control.

SUMMARY OF THE INVENTION

The disclosed apparatus relates to a current sensing electrical energy generation system comprising, an electric machine, a conductor electrically connected to the electric machine, and a current sensor responsive to current flow in the conductor.

Further disclosed herein relates to a vehicle idle improvement system. The system comprising, an electric machine, a conductor electrically connected to the electric machine, a current sensor responsive to current flow in the conductor, and microprocessor type circuitry in operable communication with the electric machine and receptive to information obtainable from the current sensor.

BRIEF DESCRIPTION OF THE DRAWINGS

Referring now to the drawings wherein like elements are numbered alike in the several Figures.

DETAILED DESCRIPTION OF THE INVENTION

Figure 1:
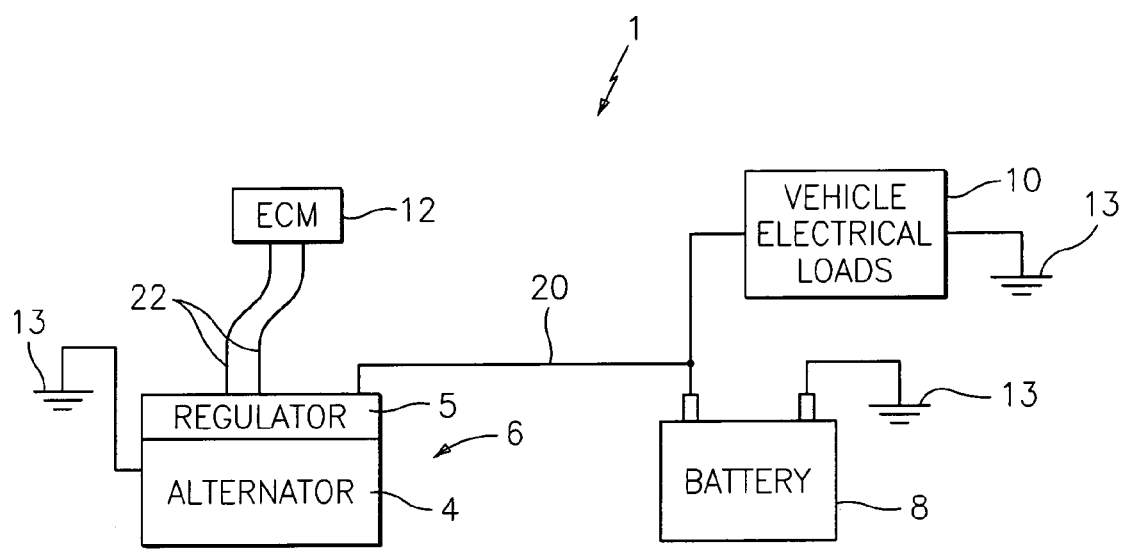
FIG. 1 is a prior art schematic of a vehicle electrical system.

Referring to FIG. 1 a prior art vehicle electrical schematic is shown generally at 1. The vehicle electrical schematic comprising, an alternator/regulator assembly 6, a battery 8, vehicle electrical loads 10, electronic control module (ECM) 12, and grounds 13. The alternator/regulator assembly 6 further comprising alternator 4 and regulator 5. It will be appreciated that the ECM 12 controls the output of the alternator/regulator assembly 6 through wires 22 connecting the ECM 12 to the regulator 5. The B+ wire 20 connects the output of the alternator/regulator assembly 6 to the battery 8 and the vehicle electrical loads 10. A common ground 13, grounds the alternator/regulator assembly 6, the battery 8 and the vehicle electrical loads 10.

Figure 2:
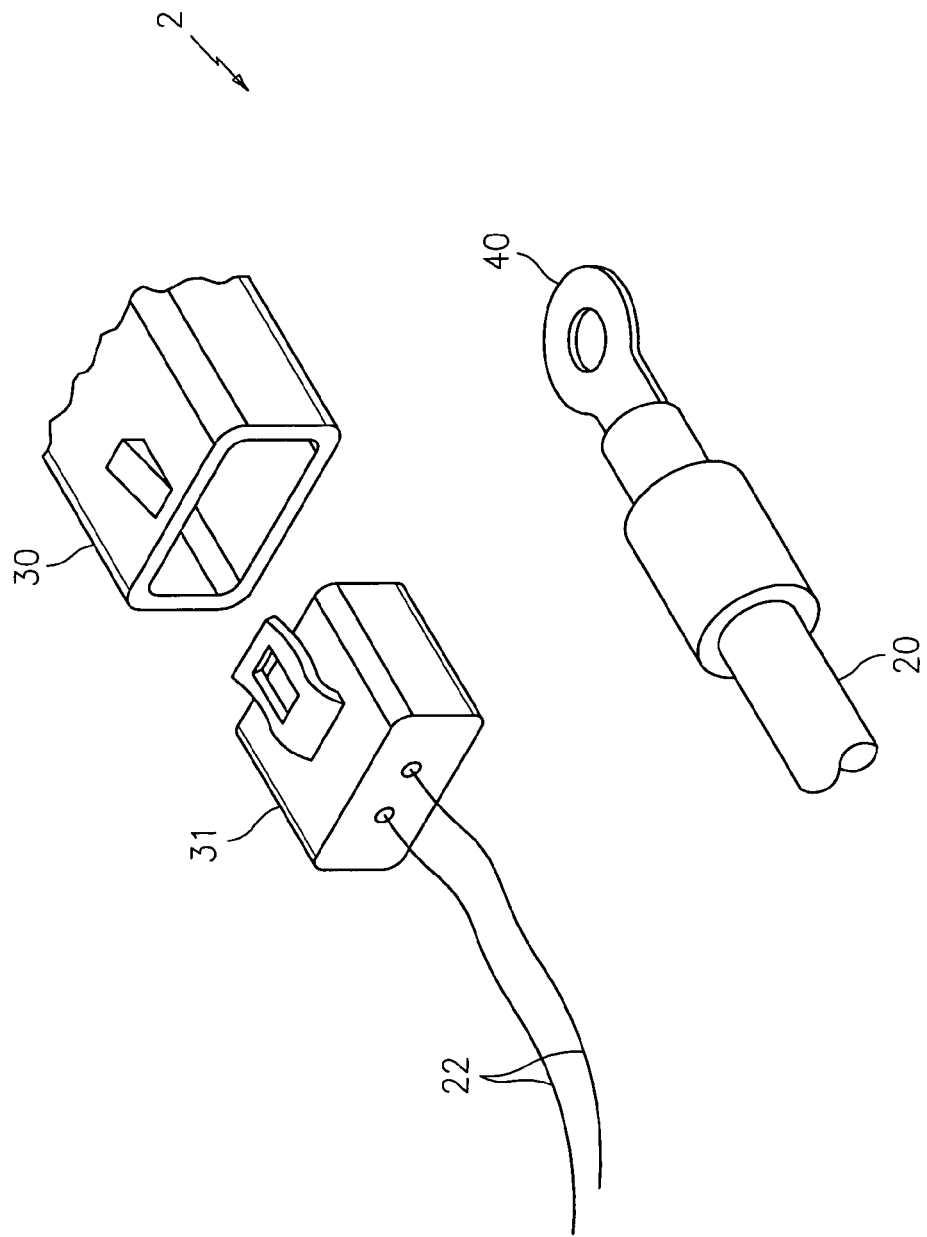
FIG. 2 is a diagrammatic view of prior art connections used in vehicle alternator/regulator assembly systems.

FIG. 2 is a partial diagrammatic view of wiring connections for the schematic FIG. 1 shown generally at 2. A first end of the B+ wire 20 is terminated in a B+ wire ring terminal 40 for connection to an output stud of an alternator/regulator assembly 6. The second end of the B+ wire 20 is connected to the battery 8 (not shown in FIG. 2). An injection molded two-way female insulator 30 is fixedly attached to a body of the alternator/regulator assembly 6 (not shown in FIG. 2). Terminals within the two-way female insulator 30 are electrically connected internally to the regulator 5 of the alternator/regulator assembly 6. An injection molded two-way male insulator 31, connectable with the two-way female insulator 30, retains two terminals (not shown) that are crimped to the first ends of a pair of wires 22 that have a second end electrically connected to the ECM 12. When the two-way male insulator 31 is connected to the two-way female insulator 30 their pairs of terminals electrically engage and an electrical circuit is completed between the regulator 5 and the ECM 12 such that electrical communication can take place between the regulator 5 and the ECM 12.

Figure 3:
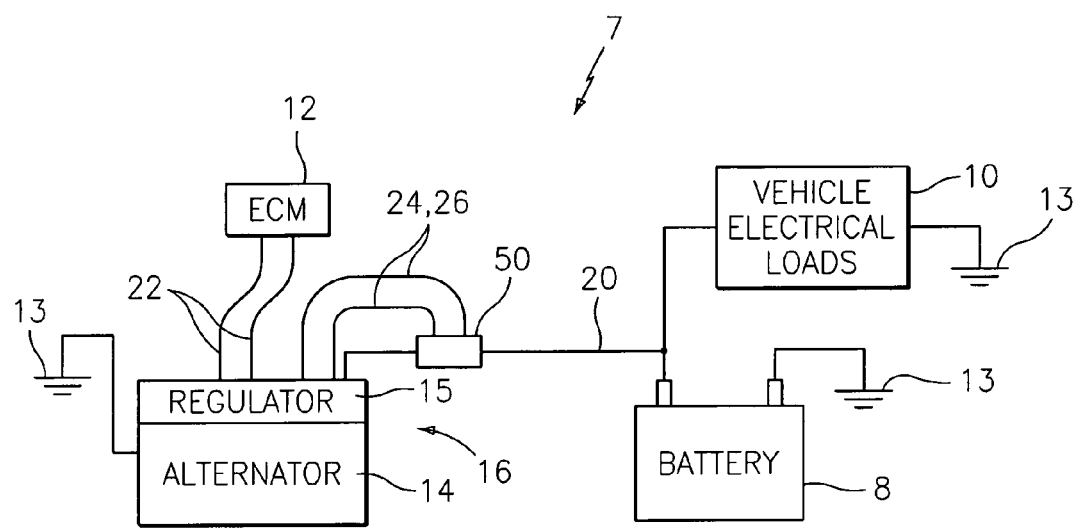
FIG. 3 is a schematic of a vehicle electrical system disclosed herein.

Referring to FIG. 3 a vehicle electrical schematic in accordance with an embodiment of the invention is shown generally at 7. The vehicle schematic 7 includes a current sensor 50 at the B+ wire 20, which connects output of the alternator/regulator assembly 16 to the battery 8 and to the vehicle electrical loads 10. The current sensor 50 is in electrical communication with the regulator 15 through wires 24, 26. The current sensor 50 can employ any of a variety of methods known in the art for measuring the current flowing through a conductor without deviating from the invention, such as; a sense resistor, a current transformer or a Hall effect sensor, for example. Two-way electrical communication between the regulator 15 and the ECM 12 is completed through wires 22. A common ground 13, grounds the alternator/regulator assembly 16, the battery 8 and the vehicle electrical loads 10. A diagrammatic view of several connections in FIG. 3 can be found in FIG. 4.

Figure 4:
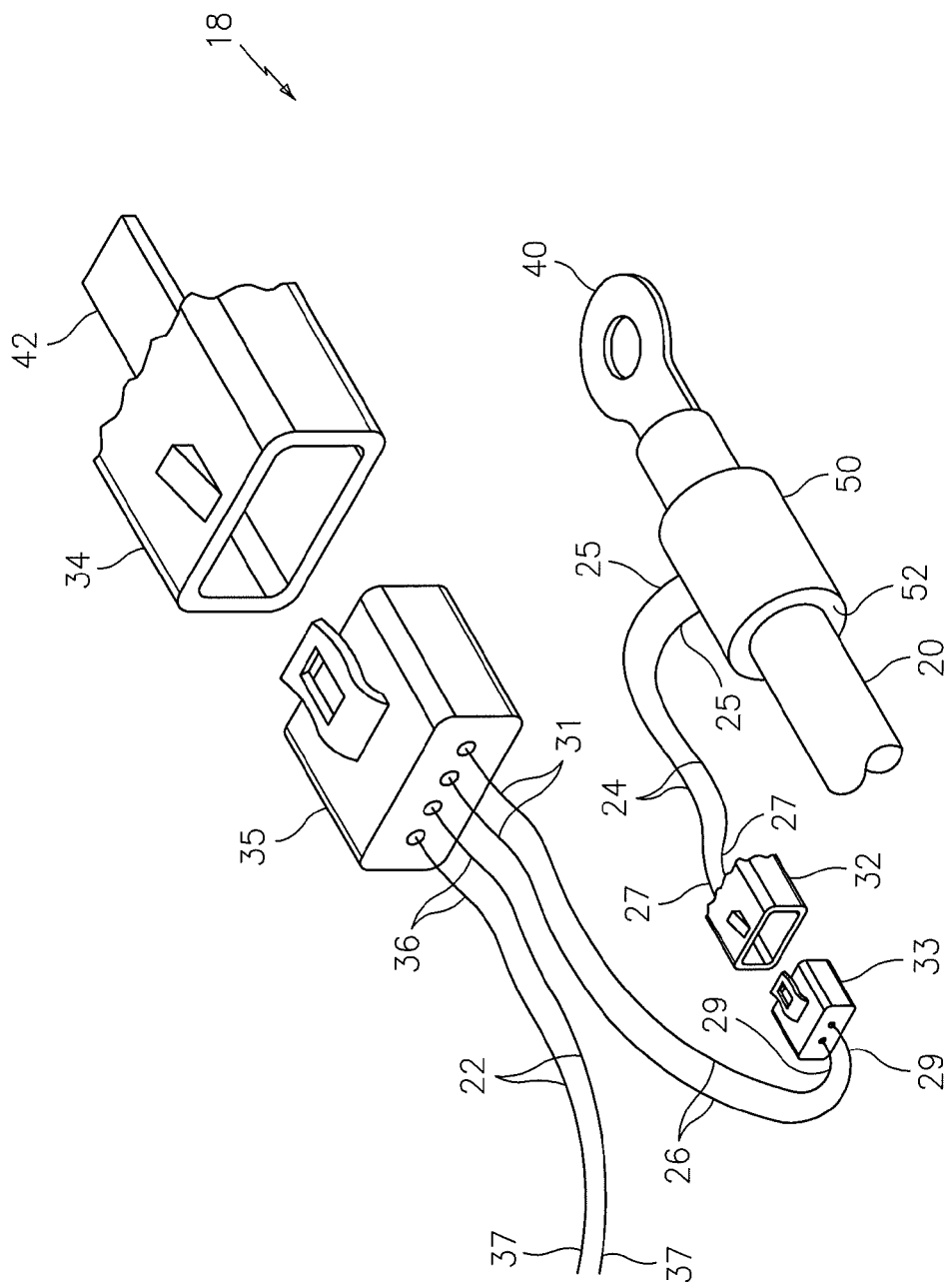
FIG. 4 is a diagrammatic view of connections with a current sensor located near a ring terminal of B+ wire disclosed herein.

FIG. 4 shows a partial diagrammatic view of the wiring connections of the schematic of FIG. 3 shown generally at 18. The current sensor 50 is shown over-molded with resin 52 around the B+ wire 20 near the alternator B+ wire ring terminal 40. A pair of wires 24 have first wire ends 25 connected to the circuit of the current sensor 50 which protrude from the over-molded resin 52 encasing the current sensor 50. The second ends 27 of wires 24 are connected into terminals (not shown) that are retained in an injection molded two-way female insulator 32. The two-way female insulator 32 is removably attached to a mating injection molded two-way male insulator 33. Terminals (not shown) retained within the two-way male insulator 33 are crimped to first ends 29 of wires 26, the second ends 31 of wires 26 are crimped into terminals that are retained within an injection molded four-way male insulator 35 that mates with injection molded four-way female insulator 34. The four-way female insulator 34 is fixedly attached to the alternator/regulator assembly 16, which houses a processing circuit 42, which includes current control circuitry for controlling current in the electric machine. The four terminals of the four-way female insulator 34 are in electrical communication with the processing circuit 42. The remaining two terminals retained in the four-way male insulator 35 are electrically connected to first ends 33 of wires 22, the second ends 37 of wires 22 are in electrical communication with the ECM 12.

The processing circuit, through the connections thus described, is in electrical communication with the ECM 12, the regulator 15, and the current sensor 50. Through these connections the current output of the alternator/regulator assembly 16 can be used as input to the ECM 12 as a control variable. It should be understood that various wire routings and connector configurations, for example, could be employed without deviating from the present invention.

Figure 5:
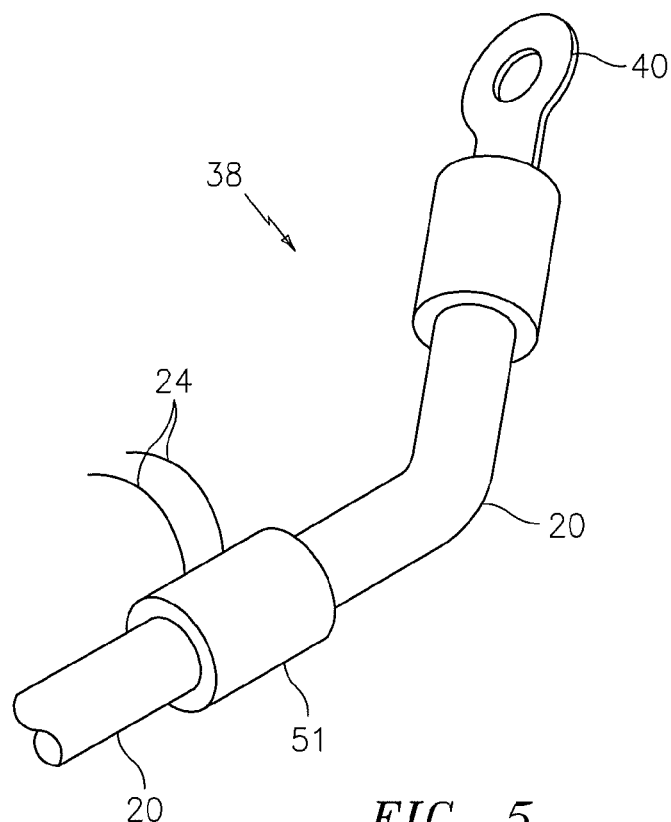
FIG. 5 is a diagrammatic view of an alternate embodiment with a current sensor located along the length of a B+ wire disclosed herein.

Referring now to FIG. 5, an alternate embodiment of the invention is shown in diagrammatic view shown generally at 38. In this embodiment a current sensor 51 is located along a length of a B+ wire 20 remote from the B+ wire ring terminal 40. Locating the current sensor 51 remotely from the ring terminal 40 addresses concerns of space limitations near the output terminal of the alternator/regulator assembly 16 that may not accommodate the addition of a current sensor 50 of the earlier described embodiment.

Figure 6:
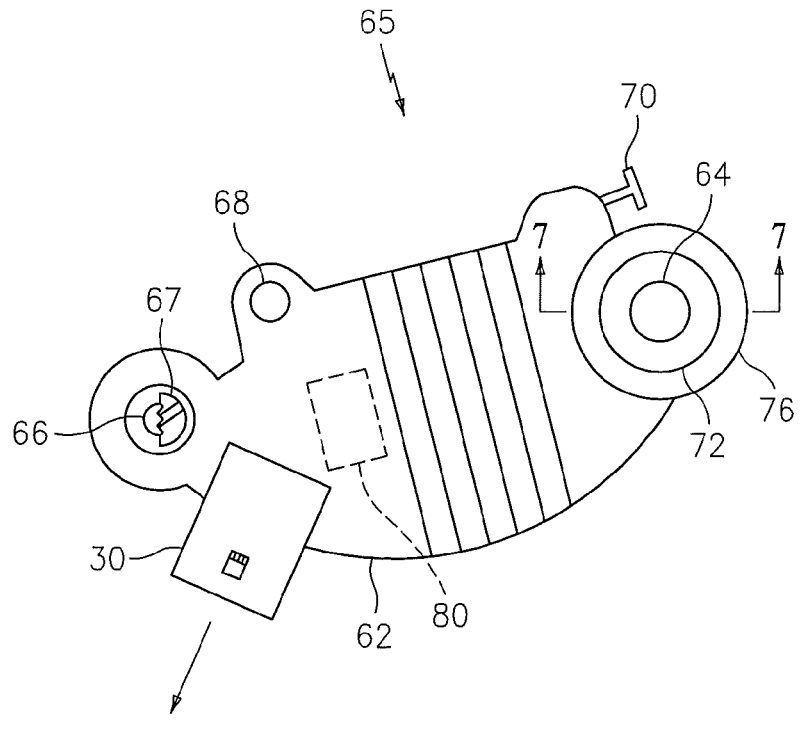
FIG. 6 is a plan view of an exemplary embodiment of a regulator assembly disclosed herein.
Figure 7:
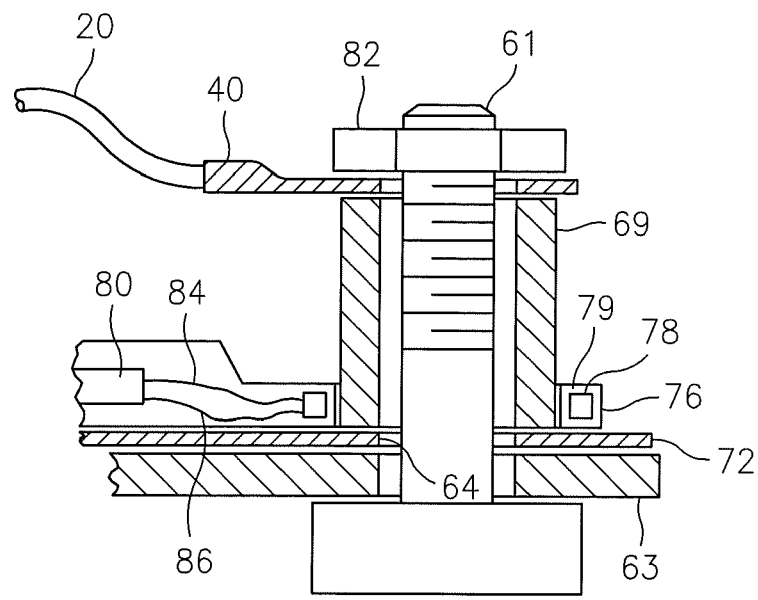
FIG. 7 is a partial cross sectional view of FIG. 6 taken at arrows 7-7.
Figure 8:
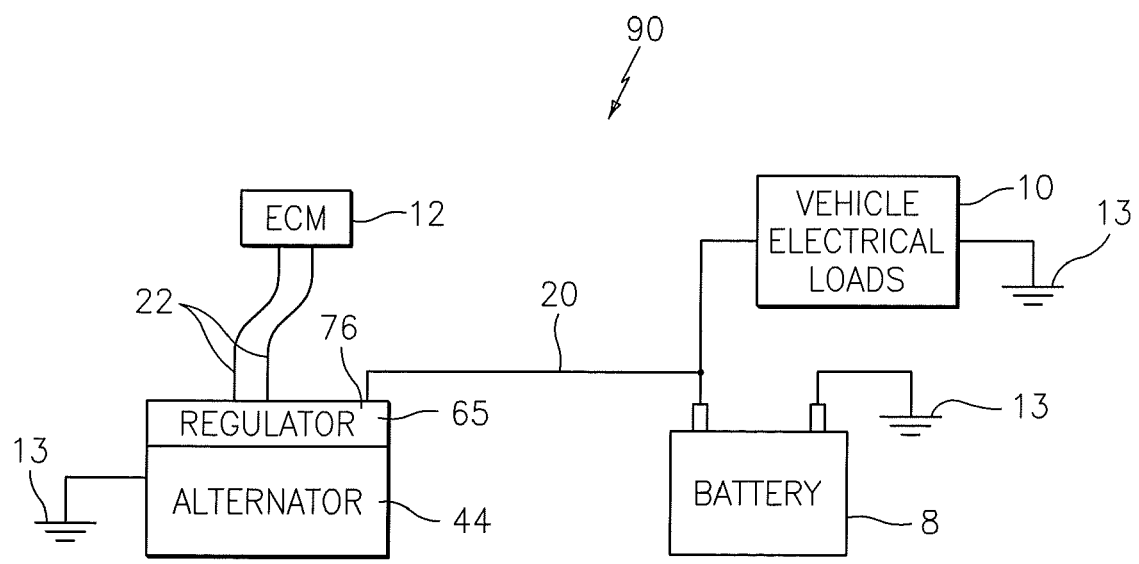
FIG. 8 is a schematic of a vehicle electrical system employing the embodiment of FIG. 6.

Referring to FIGS. 6 and 7, an exemplary embodiment of a regulator assembly disclosed herein is depicted at 65. The regulator assembly 65 is structurally connected to the alternator 44 (FIG. 8) and provides electrical connections to electrically interface the alternator 44 to the vehicle electrical system or ECM 12. The regulator assembly 65 is structurally mounted to the alternator 44. A fastener 67 shown herein as a screw, threadably attaches one end of an elongated body 62 of the regulator assembly 65 through a first hole 66 therein. A second hole 64 on an opposite end of the body 62 receives an alternator B+ output stud 61 upon which is threadably engaged a nut 82 that compresses a spacer 69 onto a lead frame 72. The spacer 69 may be made of metal, or other electrically conductive material for example, to assist in completing an electrical connection between the B+ stud 61 and the lead frame 72 in addition to providing the structural mounting for the regulator assembly 65 to the alternator 44. The B+ stud 61 protrudes through and is fixedly attached to a support plate 63 of the alternator 44.

The electrical interface of the regulator assembly 65 to the alternator 44 occurs through terminals 68 and 70 as well as through the B+ stud 61 to the lead frame 72 structural connection described above. Additionally, the regulator assembly 65 comprises a current sensor 76 to measure the current flow through the B+ stud 61. A core 78 of the current sensor 76 is overmolded with resin 79 to electrically insulate it from the B+ stud 61, the spacer 69 and the lead frame 72. Leads 84 and 86 from the core 78, of the current sensor 76, are electrically connected to the current sensor processing circuit 80 housed within the regulator assembly 65. Additionally the leads 84 and 86 are overmolded with resin 79 with the rest of the regulator body 62 and the current sensor 76. The current sensor 76 shown in this exemplary embodiment is of the Hall effect type, however other current sensing methods may be employed.

The regulator assembly 65 also provides electrical communication to the ECM 12. An injection molded two-way female insulator 30 is fixedly attached to the body 62 of the regulator assembly 65. An injection molded two-way male insulator 31 connectable with the two-way female insulator 30 electrically connects the regulator assembly 65 with bi-directional communication via wires 22 with the ECM 12 as shown in a vehicle schematic 90 in FIG. 8. B+ wire 20 electrically connects the B+ stud 61 of the alternator 44 to the battery 8 and the vehicle electrical loads 10. A common ground 13 provides ground to the alternator 44, the battery 8 and the electrical loads 10.

Packaging the current sensor core 78 around the B+ stud 61 and housing the processing circuit 80 within the regulator assembly 65, permits the addition of the current sensing feature and the current control circuitry without requiring physical changes to the vehicle, thereby avoiding cost increases associated with adding a stand alone current sensor that would require additional wire connections as well as a housing for the current sensor.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best or only mode contemplated for carrying out this invention, but that the invention will include all embodiments falling within the scope of the appended claims.

What is claimed is:

1. A current sensing electrical energy generation system, comprising:
    an electric machine;
    a conductor in electrical communication with the electric machine;
    a current sensor responsive to current flow in the conductor; and
    a regulator disposed at the electric machine having current control circuitry to which the current sensor is electrically connected.

2. The system of claim 1, wherein the current sensor is of the Hall effect type.

3. The system of claim 1, wherein the current sensor is of the sense resistor type.

4. The system of claim 1, wherein the current sensor is of the current transformer type.

5. The system of claim 1, wherein the electric machine is an alternator.

6. The system of claim 5, wherein the conductor is a wire connected to an output of the alternator.

7. The system of claim 6, wherein the current sensor is attached to the wire.

8. The system of claim 5, wherein the conductor is a B+ stud connected to an output of the alternator.

9. The system of claim 1, wherein the current sensor is integral with the regulator.

10. The system of claim 9, wherein a B+ stud of the alternator extends through an annular portion of the regulator.

11. The system of claim 1, wherein the current control circuitry is microprocessor type circuitry.

12. The system of claim 1, wherein the current control circuitry modifies operating conditions of the electric machine in response to information obtainable from the current sensor.

* * * * *